United States Patent
Kumar et al.

(10) Patent No.: US 8,103,919 B1
(45) Date of Patent: Jan. 24, 2012

(54) CIRCUIT FOR AND METHOD OF REPAIRING DEFECTIVE MEMORY

(75) Inventors: Subodh Kumar, San Jose, CA (US); Weiguang Lu, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 264 days.

(21) Appl. No.: 12/359,212

(22) Filed: Jan. 23, 2009

(51) Int. Cl.
*G11C 29/00* (2006.01)
*G01R 31/28* (2006.01)

(52) U.S. Cl. .................. 714/718; 714/711; 714/736

(58) Field of Classification Search .................. 714/718, 714/710, 719, 819, 733, 734, 30, 736, 711, 714/725; 365/200, 201, 225.7, 189.011, 365/185.33
See application file for complete search history.

(56) References Cited

U.S. PATENT DOCUMENTS

| | | | | |
|---|---|---|---|---|
| 5,200,959 A | * | 4/1993 | Gross et al. ................... | 714/723 |
| 7,314,174 B1 | * | 1/2008 | Vadi et al. ................... | 235/462.1 |
| 7,318,014 B1 | * | 1/2008 | Molson et al. ................... | 703/13 |
| 7,408,381 B1 | | 8/2008 | Drimer et al. | |
| 7,525,362 B1 | | 4/2009 | Lesea et al. | |
| 7,539,923 B1 | * | 5/2009 | Knopp ................... | 714/766 |
| 7,539,926 B1 | | 5/2009 | Lesea | |
| 7,805,593 B1 | * | 9/2010 | Donlin ................... | 712/227 |
| 7,890,916 B1 | * | 2/2011 | Donlin et al. ................... | 716/116 |

OTHER PUBLICATIONS

Rizzolo, R. F., et al, "IBM Systems z9eFUSE Applications and Methodology", IBM J. Res. & Dev., vol. 51, No. 1/2 Jan./Mar. 2007.

\* cited by examiner

*Primary Examiner* — Phung M Chung
(74) *Attorney, Agent, or Firm* — John J. King; Thomas George

(57) ABSTRACT

A circuit for repairing defective memory of an integrated circuit is disclosed. The circuit includes blocks of memory; and interconnect elements providing data to each of the blocks of memory, where the interconnect elements enable coupling together the signals for programming the blocks of memory. The circuit also includes a directory of locations for defective memory cells of blocks of memory, where the directory of locations is common to the blocks of memory for storing locations of defective memory cells of the blocks of memory. Methods of repairing defective memory of an integrated circuit are also disclosed.

16 Claims, 7 Drawing Sheets

| Repair Pointer | Field Name | Comment |
|---|---|---|
| R[15] | Top/Bottom | FAR Bottom(1) or Top (0) |
| R[14:12] | Row[2:0] | FAR Row address (max 4 rowa for 1x500) |
| R[11:7] | Column [4:0] | FAR Column address (max 16 BRAM columns) |
| R[6] | AH | Above HCLK (1) |
| R[5] | UB | Upper Bank (1) |
| R[4:0] | Index[4:0] | Index 1-18 for 18 RSR bits |
Frame Address
FIG. 5
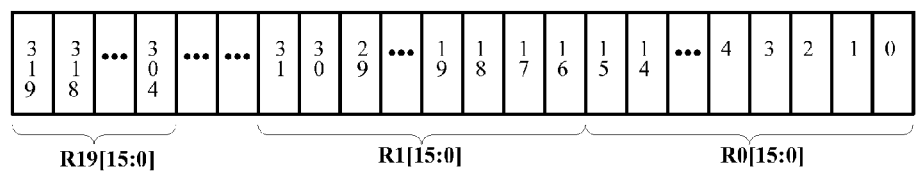
FIG. 6
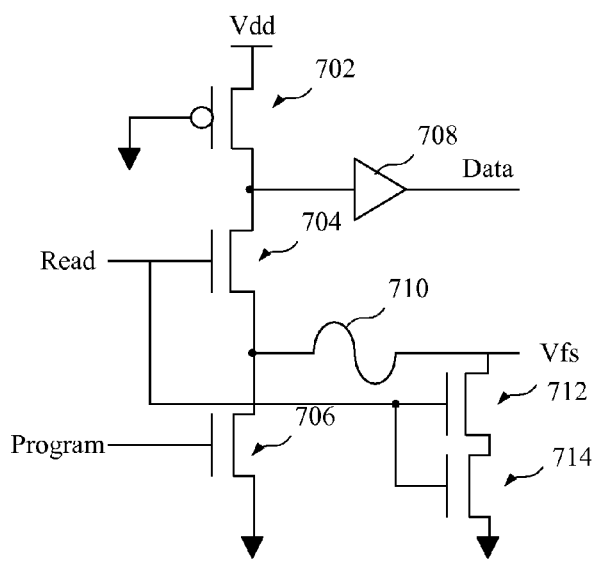
FIG. 7

CIRCUIT FOR AND METHOD OF REPAIRING DEFECTIVE MEMORY

FIELD OF THE INVENTION

The present invention relates generally to integrated circuits, and in particular, to a circuit for and method of repairing defective memory of an integrated circuit.

BACKGROUND OF THE INVENTION

When manufacturing a product, it is important that the resulting product is reliable and that little waste is generated in the manufacturing process. When manufacturing integrated circuits, it is important to ensure that elements of the integrated circuit are functioning properly. Therefore, integrated circuits are typically tested to determine whether they are functioning properly before they are shipped. Depending upon the results of the testing, the integrated circuits may be categorized according to certain performance criteria, such as the speed of the device for example. An integrated circuit may even be discarded if a certain number of defects are found in the integrated circuit. For example, if more than two defective memory cells are found in a block of random access memory, the integrated circuit may be discarded. Discarding defective integrated circuits decreases the yield of a batch of wafers, thereby affecting the overall cost of manufacturing the integrated circuits. Accordingly, there is always an effort in the manufacture of integrated circuits to improve the yield.

Memory cells are one element of an integrated circuit which may be determined to be defective. Although redundant memory cells may be selected if a memory cell is determined to be defective in order to improve yield, the amount of circuitry required to improve the yield may be prohibitive. That is, the amount of circuitry needed to compensate for defective memory cells may significantly reduce the available memory or the area for other circuitry in a die.

SUMMARY OF THE INVENTION

A circuit for repairing defective memory of an integrated circuit is disclosed. The circuit includes a plurality of blocks of memory; and interconnect elements providing data to each block of memory of the plurality of blocks of memory, the interconnect elements enabling coupling signals for programming the plurality of blocks of memory. The circuit also includes a directory of locations for defective memory cells of blocks of memory, wherein the directory of locations is common to the plurality of blocks of memory for storing locations of defective memory cells of the plurality of blocks of memory. The directory of locations may comprise electrically programmable fuses having a plurality of programmable elements identifying the locations of the defective memory cells. The circuit may further comprise a self-repair state machine coupled to the plurality of blocks, wherein the self-repair state machine determines the locations of memory cells of the plurality of blocks of memory storing incorrect values.

A method of repairing defective memory of an integrated circuit is also disclosed. The method includes detecting the locations of defective memory cells of a plurality of blocks of memory; recording the locations of the defective memory cells of the plurality of blocks of memory in a directory of locations of defective memory cells common to the plurality of blocks of memory; and transforming the blocks of memory of the plurality of blocks of memory having defective memory cells recorded in the directory of locations of defective memory cells by selecting a redundant column of each block of memory having a defective memory cell. Detecting the locations of defective memory cells may comprise performing a built-in self test using a test pattern. Transforming the blocks of memory may comprise coupling control signals by way of read/write logic of the plurality of blocks of memory.

According to an alternate embodiment, a method of repairing defective memory of an integrated circuit includes creating a directory having a predetermined number of locations for storing data associated with defective memory cells of a plurality of blocks of memory for each integrated circuit of a plurality of integrated circuits; testing the plurality of integrated circuits; determining the average number of blocks of memory having defective memory cells for the plurality of integrated circuits; and creating a directory having a new number of locations for storing data associated with defective memory cells if the average number of blocks of memory having defective memory cells for the plurality of integrated circuits exceeds a predetermined value. The method may further comprise determining an optimal number of locations for storing data associated with defective memory cells for a predetermined architecture of a device having programmable logic.

BRIEF DESCRIPTION OF THE DRAWINGS

FIG. 5 is a table showing bits of a repair pointer according to an embodiment of the present invention;

FIG. 6 is a diagram showing a data stream having bits identifying the locations of defective memory cells according to an embodiment of the present invention;

FIG. 7 is a block diagram of an efuse according to an embodiment of the present invention;

DETAILED DESCRIPTION OF THE DRAWINGS

Figure 1:
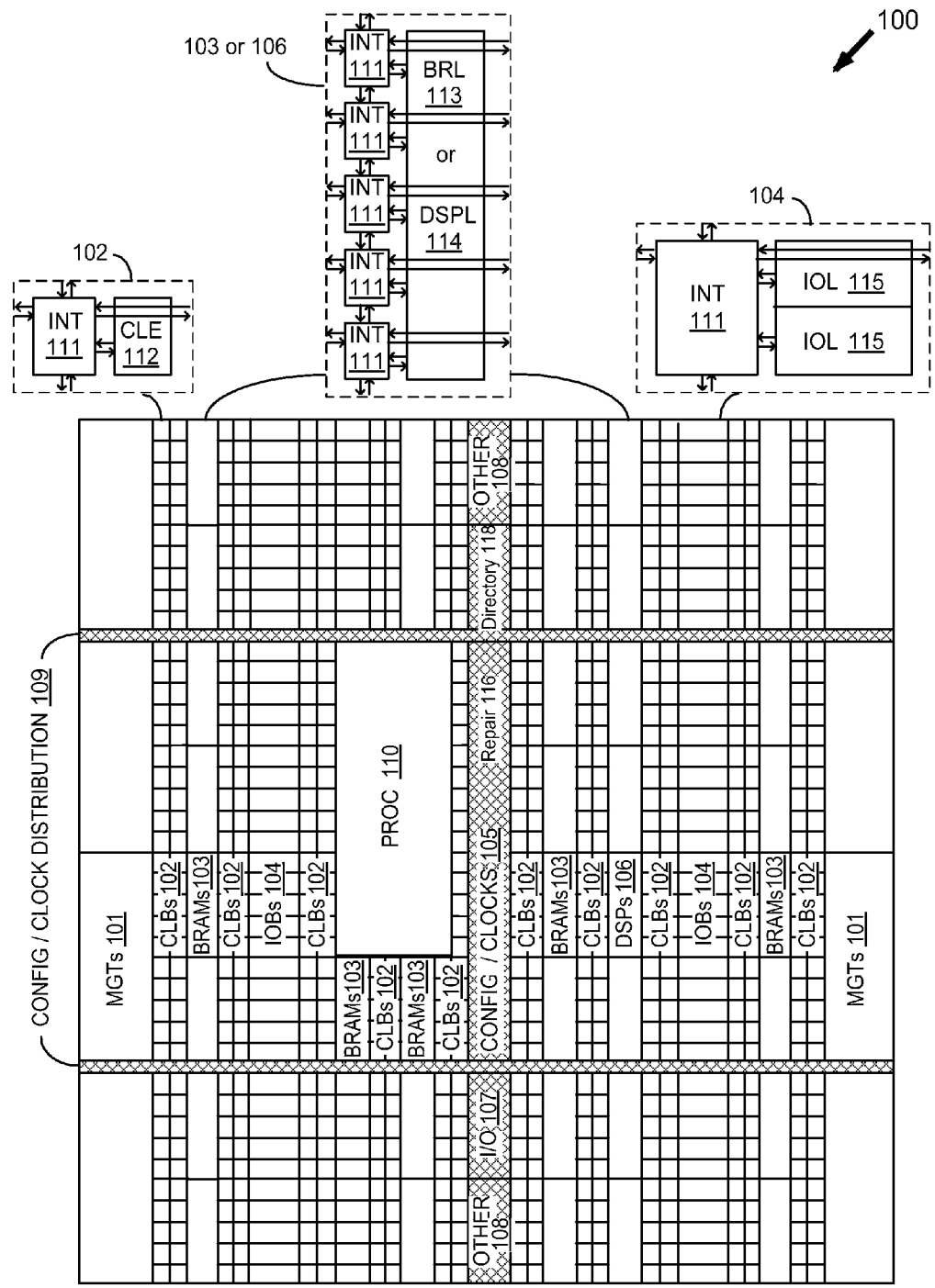
FIG. 1 is a block diagram of a device having programmable logic according to an embodiment the present invention.

Turning first to FIG. 1, a block diagram of a device having programmable logic according to an embodiment the present invention is shown. While devices having programmable logic may be implemented in any type of integrated circuit device, such as an application specific integrated circuit (ASIC) having programmable logic, other devices comprise dedicated programmable logic devices. A programmable logic device (PLD) is an integrated circuit device designed to be user-programmable so that users may implement logic designs of their choices. One type of PLD is the Complex Programmable Logic Device (CPLD). A CPLD includes two or more "function blocks" connected together and to input/output (I/O) resources by an interconnect switch matrix. Each function block of the CPLD includes a two-level AND/OR structure similar to that used in a Programmable Logic Array (PLA) or a Programmable Array Logic (PAL) device. Another type of PLD is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. These CLBs, IOBs, and programmable routing resources are customized by loading a configuration bitstream, typically from off-chip memory, into configuration memory cells of the FPGA. For both of these types of programmable logic devices, the functionality of the device is controlled by configuration data bits of a configuration bitstream provided to the device for that purpose. The configuration data bits may be stored in volatile memory (e.g., static memory cells, as in FPGAs and some CPLDs), in non-volatile memory (e.g., flash memory, as in some CPLDs), or in any other type of memory cell.

The device of FIG. 1 comprises an FPGA architecture 100 having a large number of different programmable tiles including multi-gigabit transceivers (MGTs 101), configurable logic blocks (CLBs 102), random access memory blocks (BRAMs 103), input/output blocks (IOBs 104), configuration and clocking logic (CONFIG/CLOCKS 105), digital signal processing blocks (DSPs 106), specialized input/output blocks (I/O 107) (e.g., configuration ports and clock ports), and other programmable logic 108 such as digital clock managers, analog-to-digital converters, system monitoring logic, and so forth. Some FPGAs also include dedicated processor blocks (PROC 110).

In some FPGAs, each programmable tile includes a programmable interconnect element (INT 111) having standardized connections to and from a corresponding interconnect element in each adjacent tile. Therefore, the programmable interconnect elements taken together implement the programmable interconnect structure for the illustrated FPGA. The programmable interconnect element (INT 111) also includes the connections to and from the programmable logic element within the same tile, as shown by the examples included at the top of FIG. 1.

For example, a CLB 102 may include a configurable logic element (CLE 112) that may be programmed to implement user logic plus a single programmable interconnect element (INT 111). A BRAM 103 may include a BRAM logic element (BRL 113) in addition to one or more programmable interconnect elements. The BRAM comprises dedicated memory separate from the distributed RAM of a configuration logic block. As will be described in more detail below, the interconnect elements used for a BRAM may be used for repairing the defective memory cell. Typically, the number of interconnect elements included in a tile depends on the height of the tile. In the pictured embodiment, a BRAM tile has the same height as four CLBs, but other numbers (e.g., five) may also be used. A DSP tile 106 may include a DSP logic element (DSPL 114) in addition to an appropriate number of programmable interconnect elements. An IOB 104 may include, for example, two instances of an input/output logic element (IOL 115) in addition to one instance of the programmable interconnect element (INT 111). The location of connections of the device is controlled by configuration data bits of a configuration bitstream provided to the device for that purpose. The programmable interconnects, in response to bits of a configuration bitstream, enable connections comprising interconnect lines to be used to couple the various signals to the circuits implemented in programmable logic, or other circuits such as BRAMs 103 or the processor.

In the pictured embodiment, a columnar area near the center of the die (shown shaded in FIG. 1) is used for configuration, clock, and other control logic. Horizontal areas 109 extending from this column are used to distribute the clocks and configuration signals across the breadth of the FPGA. Some FPGAs utilizing the architecture illustrated in FIG. 1 include additional logic blocks that disrupt the regular columnar structure making up a large part of the FPGA. The additional logic blocks may be programmable blocks and/or dedicated logic. For example, the processor block PROC 110 shown in FIG. 1 spans several columns of CLBs 102 and BRAMs 103. Finally, a self-repair repair state machine 116 and a directory 118 enable both the identification and correction of defective memory cells of the BRAMs 103. As will be described in more detail below, the self-repair state machine 116 will test the BRAMs 103 to determine the locations of cells which may be defective. The locations of defective memory cells for all of the BRAMs 103 of the device will be stored in the directory 118 which is common to all of the BRAMs 103.

Note that FIG. 1 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 1 are purely exemplary. For example, in an actual FPGA more than one adjacent column of CLBs is typically included wherever the CLBs appear, to facilitate the efficient implementation of user logic. The circuits and methods of the present invention may be implemented in the PLD of FIG. 1, or in any other suitable device or devices, including any type of integrated circuit having blocks of random access memory.

Figure 2:
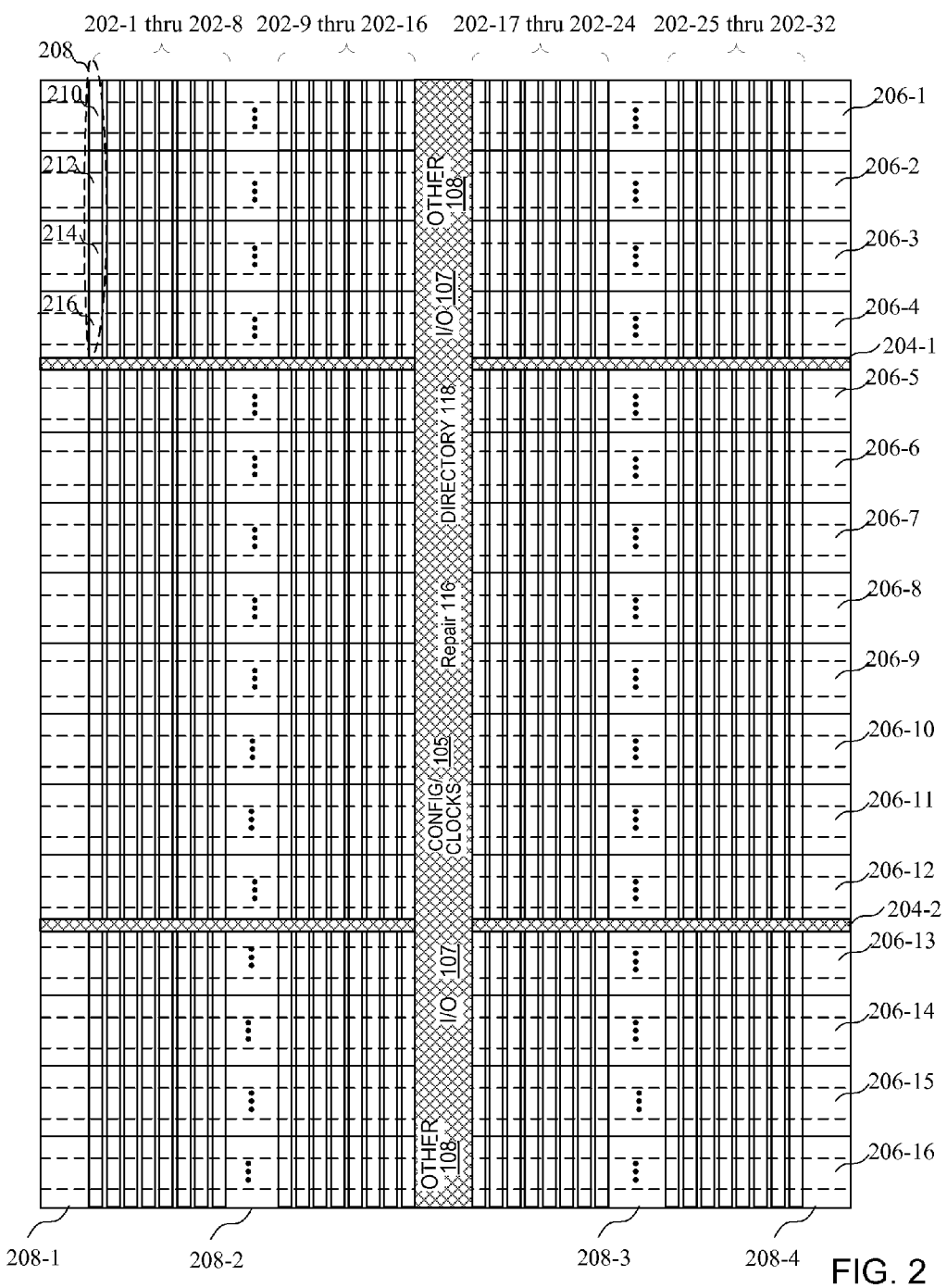
FIG. 2 is a block diagram showing a configuration of blocks of random access memory and interconnect elements according to an embodiment of the present invention.

Turning now to FIG. 2, a block diagram shows a configuration of blocks of random access memory and interconnect elements according to an embodiment of the present invention. In particular, the circuit of FIG. 2 corresponds to the circuit of FIG. 1, but shows an arrangement of blocks of random access memory and interconnect elements in more detail. While the other elements of FIG. 1, such as CLBs 102 and IOBs 104, are not shown in FIG. 2, it should be understood that some or all of the elements of FIG. 1 which are not shown in FIG. 2 could be implemented in FIG. 2.

According to the embodiment of FIG. 2, 32 columns of BRAMs are arranged in 4 groups of 8 columns which are designated 202-1 through 202-32. Each column has 16 BRAMs, with 4 BRAMs above and 4 BRAMs below each of the HCLK rows 204-1 and 204-2 which provide clocking signals to the elements of the device. Also shown are interconnect elements 206-1 through 206-16 extending from the center column along each row comprising a BRAM from each of the columns. The interconnect elements 206-1 through 206-16 comprise multiple interconnect lines which could be implemented using the interconnect elements 111 described above in reference to FIG. 1 and provide signals to the various BRAMs in the row. Although the interconnect lines are shown extending horizontally, vertical interconnect elements may also extend in the center column or on either side of the center columns to route signals to the BRAMs. A group 208 of 4 BRAMs comprising BRAMs 210-216 is shown in a first column 202-1 of BRAMs above the clock row 204-1. The group 208 comprises one half of a frame, with the other half of the frame comprising 4 BRAMs below the HCLK row 204-1. As will be described in more detail below, the self-repair state machine 116 and the directory 118 enable both detecting the locations of defective memory cells of the memory array as well as selecting a redundant column of a block of random access memory by way of the interconnect elements 206-1 through 206-16.

Figures 3, 4:
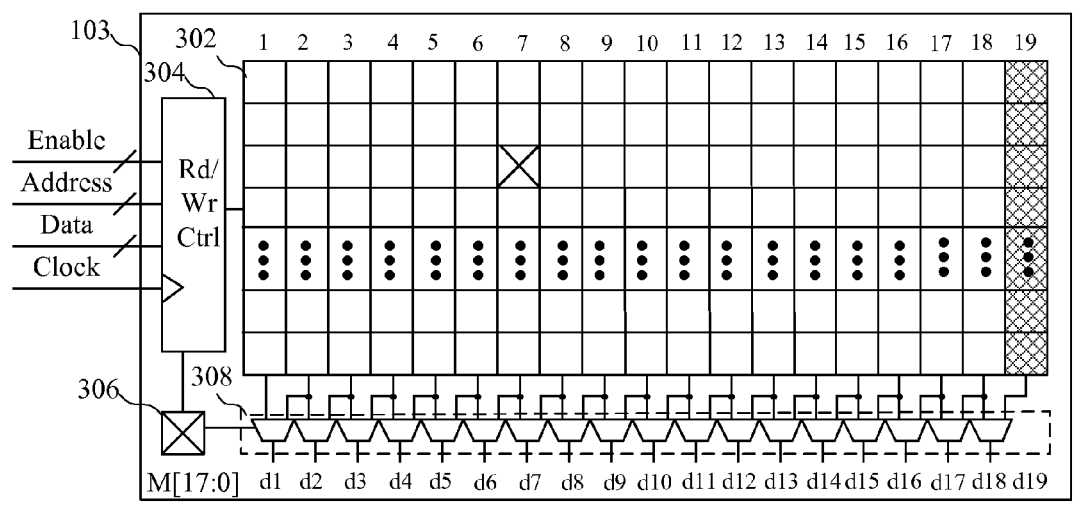
FIG. 3 is a block diagram of a block of random access memory according to an embodiment of the present invention.
FIG. 4 is a block diagram of an directory of locations of defective memory cells according to an embodiment of the present invention.

Turning now to FIG. 3, a block diagram of a block of random access memory according to an embodiment of the present invention is shown. The block diagram of FIG. 3 comprises an array 302 of memory cells. By way of example, the BRAM 103 of FIG. 3 includes 19 columns of memory cells for a circuit requiring only 18 columns. That is, while only 18 columns are normally required to store the data of the BRAM, the extra column of memory cells may be used in place of a column having a defective memory cell. A read/write control circuit 304 is coupled to receive enable, address, data and clock signals to write data to the BRAM 103. The enable, address, data and clock signals are provided to the read/write control circuit 304 by way of the interconnect elements described above in reference to FIG. 2. For example, the enable, address, and data signals could be provided to BRAM 210 by way of the interconnect element 206-1, while a clock signal could be provided to the BRAM 210 by way of interconnect lines associated with the HCLK row 204-1.

As shown in FIG. 3, the nineteenth column is a redundant column which may be selected in the event that a defective memory cell is identified in any one of the other columns. If a defective memory cell is identified, such as the third memory cell in the seventh column which is shown with an 'X' in the memory cell, the seventh column may be bypassed and columns 8-19 may be used to provide the remaining 12 columns beyond columns 1-6 for a total of 18 columns. In particular, a selection circuit 308, which may comprise a plurality of multiplexers for example, would enable selecting the outputs of columns 1-6 as outputs d1-d6 and the outputs of columns 8-19 as outputs d7-d18. In order to enable the selection of the appropriate columns, the read/write control circuit 304 could also be used to program a bank of configuration memory cells 306 designated as M[17:0] for selecting 18 of the 19 columns to output data d1-d18. In the example of FIG. 3, each of the first six multiplexers would select the first input to the multiplexer, while the remaining multiplexers would select the second input to the multiplexer, effectively bypassing the seventh column. Accordingly, data is stored in the configuration memory cells M[17:0] after determining defective memory cells of the array in order to select the correct inputs to the multiplexer and to generate the correct values for d1-d18. Methods for loading the values of M[17:0] will be described in more detail below.

According to one aspect of the present invention, rather than embedding circuitry enabling the repair of a column having a defective memory cell on each BRAM, the self-repair state machine 116 and the directory 118 are centrally located on the device and common to all devices. That is, creating overhead which is multiplied by the number of BRAMs on the device may offset the benefit of implementing the redundant circuitry for yield improvement. Because the redundant circuitry would not likely be needed for every BRAM, the size of the memory for storing the locations of the defective memory cells may be significantly reduced by providing circuitry for enabling the use of redundant columns which is used by many BRAMs and which uses interconnect elements and read/write logic for writing to the BRAM. Although a single self-repair state machine 116 and the directory 118 are shown, multiple state machines and directories may be used, where each state machine and directory is used for multiple BRAMs.

According to one embodiment, a total number of locations for storing the locations of the defective memory cells for a given device may be determined. Initially, the number of repairs which may be needed per die is estimated. By way of example, in the device of FIGS. 1 and 2 having 256 BRAMs, it may be estimated that 20 repairs per die are needed. That is, it is estimated that at most 20 of the 256 BRAMs of the device will have a column having a defective memory cell, where data for the location of each defective memory cell will be stored in one of the 20 memory locations.

In order to determine the locations of defects, a BRAM pattern comprising a test pattern is downloaded and stored in the memory cells of the BRAMs, and then read back to capture and encode fail information needed for identifying the location of defective memory cells. That is, if the data read back from a BRAM does not match the data loaded into the BRAM, one or more memory cells of the BRAM are defective. The test pattern is designed such that it will identify any memory cells of the BRAMs which are defective. As will be described in more detail below, location information is then generated for each fail per BRAM bank and stored. If more than one bit fails in a BRAM bank, the die will be discarded because the BRAM bank cannot be repaired. Because some fails may appear multiple times, the information associated with the failing bits is analyzed in a tester to calculate the minimum number of locations to be stored.

If the number of fails is less than or equal to the number of storage locations for storing the locations of defective memory cells for BRAM, the locations for defective memory cells are stored. Otherwise, the device cannot be repaired. Once the locations have been stored, the information is transferred to registers in the defective BRAMs. For example, after the locations of the defective memory cells are stored in the directory 118, they are downloaded to memory elements M[17:0] of the bank of configuration memory cells 306. As will be described in more detail below, the affect of the allocated number of storage locations on yield will be analyzed for future design optimization.

Turning now to FIG. 4, a block diagram of a directory of locations of defective memory cells according to an embodiment of the present invention is shown. Because the resolution of the location of the defects may be selected, the number of bits for identifying the location of a defective memory cell may vary and therefore be determined by a user. According to one embodiment, the resolution may be selected to identify a defective BRAM bank comprising 2 BRAMS, where the number of bits required to decode the location of each BRAM bank in the embodiment of FIG. 2 is equal to 16. As shown in FIG. 4, the directory stores twenty 16-bit words comprising repair pointers. The details of the specific bits of the repair pointers are shown in FIG. 5. In particular, a bit R[15] is used for selecting the top half or bottom half of the device. Bits R[14:12] provides a row index for selecting one of eight rows in either the top of or bottom of the device, while bits R[11:7] provides a column index for selecting one of thirty two columns. Bit R6 indicates whether a defective cell identified by the repair pointer is above or below a given HCLK row. Bit R5 indicates whether the cell is in the upper bank or the lower bank of the banks which are above or below the HCLK row. That is, because there are 2 banks comprising 4 BRAMs above or below the HCLK row, the bit R5 identifies one of the two banks. The R[4:0] bits indicate an index of 1-18 for the 18 columns which may have a defect. Finally, a data stream having bits identifying the locations of defective memory cells identified by 20 pointers each having 16 bits is shown in FIG. 6.

Therefore, a total of 16 bits would be required to identify the location of a defective memory cell. It should be noted that the calculation of 16 bits is provided by way of example based upon the smallest identifiable element of the device being a BRAM bank comprising 2 BRAMs, where both BRAMs in a BRAM bank are repaired simultaneously, both 18K BRAMs inside a 36K BRAM are repaired simultaneously, and both ports A and B inside each 18K BRAM are repaired simultaneously. However, more or fewer bits could be employed to have a greater or lesser resolution.

The directory of FIG. 4 may be employed in any device having capacity for storing the required bits for establishing the location of defects. As will be described in more detail below in reference to FIG. 7, the memory elements implemented in the 16×20 array of memory elements of FIG. 4 may be efuses, which are electrically programmable fuses for generating either a logical "1" or "0" at the output of the memory element. While an efuse is beneficial because it will always maintain the same value upon power up once the appropriate efuses are blown, the memory elements for storing data related to the location of defective memory cells may be implemented in any type of memory.

Turning now to FIG. 7, a circuit having an efuse according to one embodiment of the invention is shown. In particular, a first series of transistors comprises a p-channel transistor 702 having a source coupled to a power supply Vdd, a gate coupled to ground and a drain coupled to a drain of an n-channel transistor 704. The gate of the transistor 704 is coupled to receive a read signal. The source of transistor 704 is coupled to a drain of a programming transistor 706 which receives a programming signal at its gate. A comparator 708 is coupled to receive the voltage at the drains of transistors 702 and 704 at an input and compare the value to a known value. Depending upon the value at the drains of transistors 702 and 704, the comparator 708 will generate a low or high output based upon the state of an efuse. That is, an efuse 710 is coupled between the drain of the transistor 706 and a node at a drain of a transistor 712 of a series of transistors 712 and 714 coupled to receive the read signal at their gates.

When programming the efuse, the program signal is pulled high to turn on transistor 706 and the programming voltage is applied to the efuse, causing the efuse to blow. That is, when the programming transistor 706 is turned on, a low resistance current path is provided between Vfs and ground, enabling a large current flowing through the low resistance path of transistor 706 to blow the fuse and create an open circuit. The efuse 710 may be a polysilicon layer between the drains of transistors 706 and 712. Therefore, if the efuse has been blown, the node at the input to the comparator 708 will be pulled high by transistor 702 when reading the data. If the efuse has not been blown, a low resistance path is provided between the node at the drains of transistors 702 and 704 and ground by way of transistors 704, 712 and 714. Therefore, the voltage at the input of comparator 708 will be low, enabling the comparator to determine that the efuse has been blown. It should be noted that when reading the voltage at the drain of transistor 702, Vfs should be floating, or preferably tied to ground to provide a low impedance path to ground.

Figure 8:
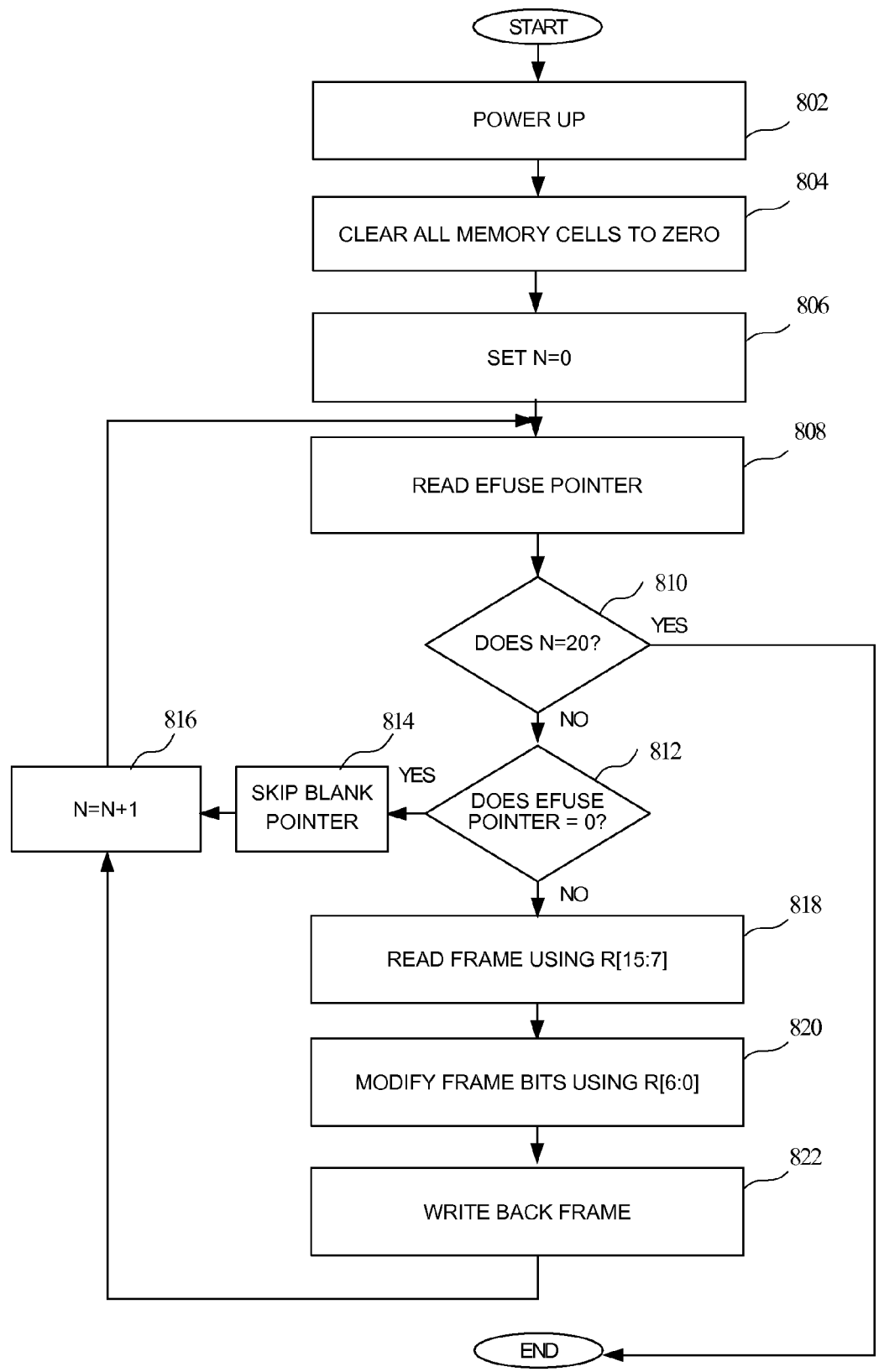
FIG. 8 is a flow chart showing the operation of a self-repair state machine according to an embodiment of the present invention.

Turning now to FIG. 8, a flow chart shows the operation of a self-repair state machine according to an embodiment of the present invention. The method of FIG. 8, as well as the method of FIGS. 9 and 10, may be implemented using any of the circuits as described above, or any other suitable circuit. In particular, the device is powered up at a step 802. All memory cells of frames having defective memory cells are cleared to zero at a step 804, where the locations of the defective memory cells have previously been determined by self-repair state machine. The pointer number N is set equal to 0 at a step 806. An efuse pointer is read at a step 808. It is then determined whether N=20 at a step 810. If so, all of the efuse pointers have been read, and the process is ended. Otherwise, it is determined whether the efuse pointer is equal to 0 at a step 812. If so, the blank pointer is skipped at a step 814. That is, because no information is provided for the location of the defective cell, there is no need to modify any bits of the frame. The pointer number N is then incremented by setting N equal to N+1 at a step 816 before the next efuse pointer is read at step 808. If the efuse pointer is not equal to zero at the step 812, a frame is read using R[15:7] at a step 818. The frame bits are modified using R[6:0] at a step 820, before a write back of the frame is performed at a step 822. That is, based upon the location of the defect, the configuration of the BRAMs is transformed so that the defective column is avoided when the data is written into the BRAM and the selection bits are stored in the memory elements M[17:0] for correctly reading the data. It should be noted that while data of a frame may be written to correct a defective memory cell in one BRAM bank according to one efuse pointer, the data for the same frame may also be written to correct a defective memory cell in another BRAM bank identified by another pointer. While the method of FIG. 8 shows one example of a self-repair state machine, the location of defects and rewriting of data to the BRAMs may be implemented using other methods. Further, although the self-repair state machine is shown implemented in programmable logic of the device, the state machine could also be implemented by the processor 110.

Figure 9:
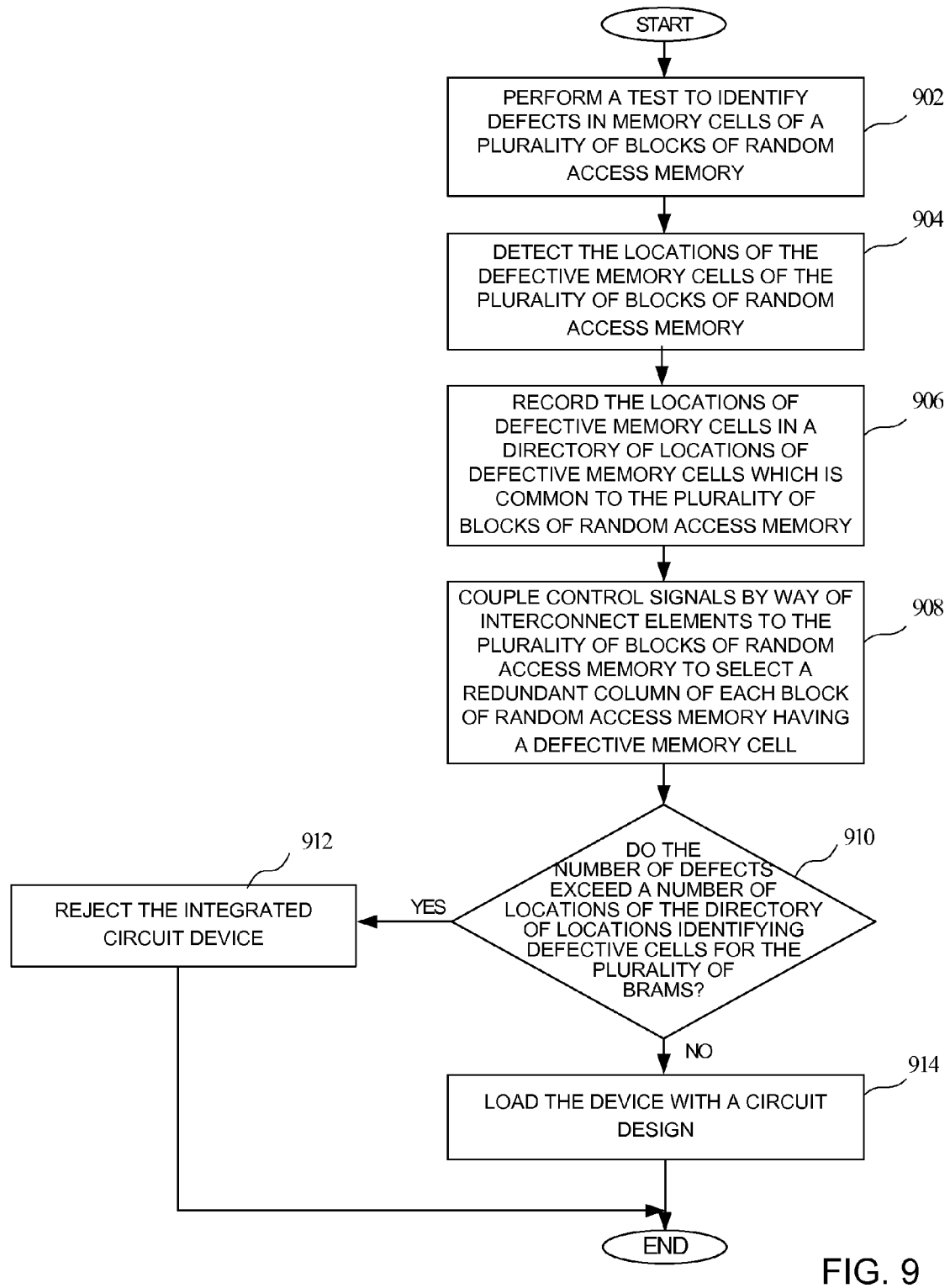
FIG. 9 is a flow chart showing a method of repairing defective memory of an integrated circuit according to an embodiment of the present invention.

Turning now to FIG. 9, a flow chart shows a method of repairing defective memory of an integrated circuit according to an embodiment of the present invention. In particular, a test to identify defects of memory cells of a plurality of blocks of random access memory is performed at a step 902. The locations of defective memory cells of the plurality of blocks of random access memory are detected at a step 904. For example, data may be stored and then read back from the memory to determine the memory cells which are defective. The locations of defective memory cells for the plurality of blocks of random access memory are recorded in a directory of locations of defective memory cells common to the plurality of blocks of random access memory at a step 906. Although an efuse such as the efuse of FIG. 7 is described above, any type of device for storing bits indicating the locations of the defects may be employed. Control signals are coupled by way of interconnect elements to the plurality of blocks of random access memory comprising defective memory cells to select a redundant column of each block of random access memory having a defective memory cell at a step 908. That is, the blocks of random access memory are transformed so that, for each block of random access memory having a defective memory cell recorded in the directory of defective memory cells, a redundant column is selected. It is then determined whether the number of defects exceeds a number of locations of the directory of locations identifying defective memory cells for the plurality of BRAMs at a step 910. If so, the integrated circuit device is rejected at a step 912. If not, the device is loaded with a circuit design at a step 914.

Figure 10:
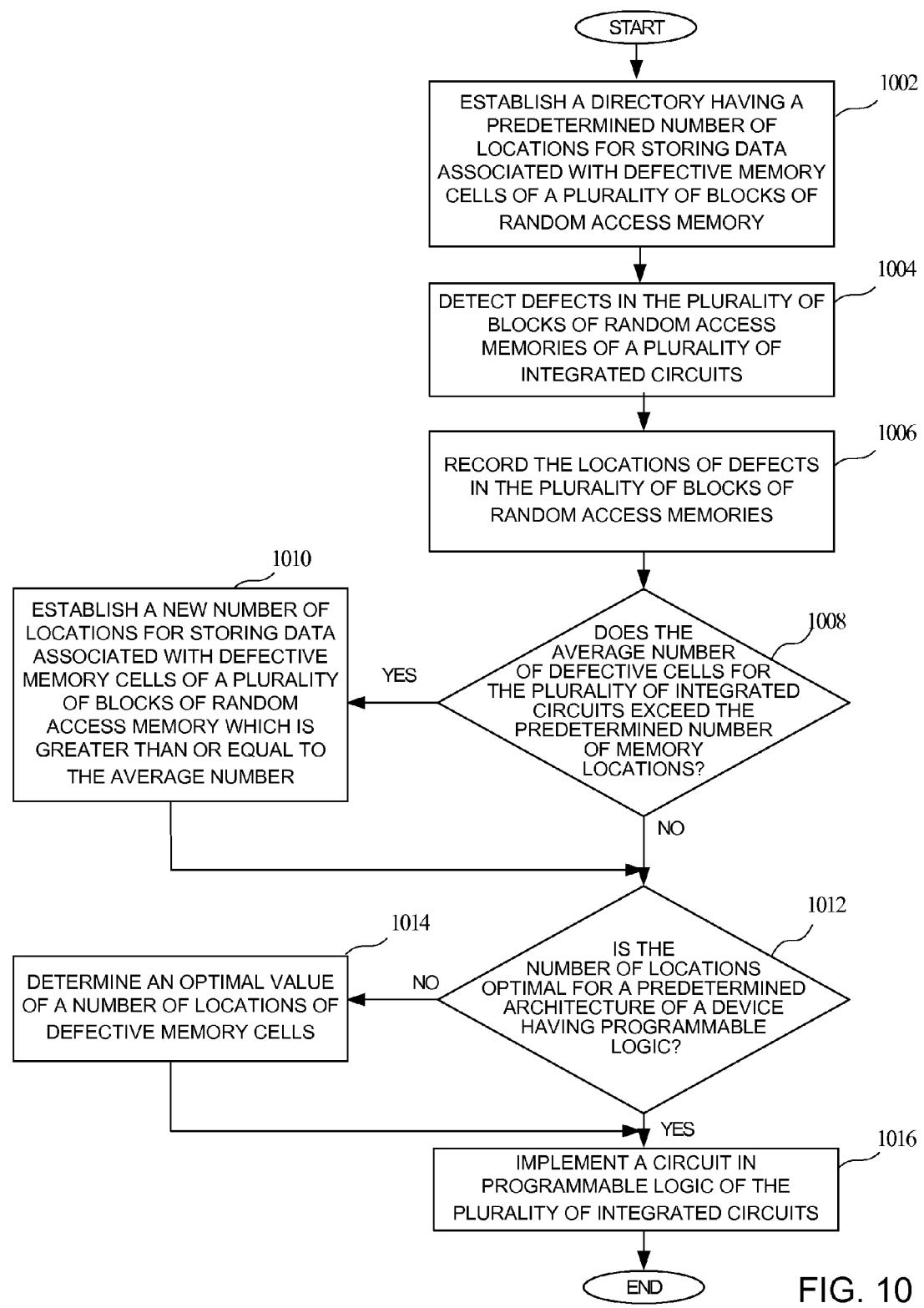
FIG. 10 is a flow chart showing a method of repairing defective memory of an integrated circuit according to an alternate embodiment the present invention.

Turning now to FIG. 10, a flow chart shows a method of repairing defective memory of an integrated circuit according to an alternate embodiment the present invention. In particular, a directory having a predetermined number of locations for storing data associated with defective memory cells of a plurality of blocks of random access memory is established at a step 1002. Defects in the plurality of blocks of random access memory of a plurality of integrated circuits are detected at a step 1004. The locations of defects in the plurality of blocks of random access memory are recorded at a step 1006. It is then determined whether the average number of defective memory cells for the plurality of integrated circuits exceeds a predetermined number of memory locations at a step 1008. If so, a new number of locations for storing data associated with defective memory cells of a plurality of blocks of random access memory is established at a step 1010. For example, the predetermined number of locations for storing data associated with defective memory cells initially may be 20. If the determined average number of defects is 18 for example, some percentage of the devices may have more than 20 defects, causing a designer to adjust the number of locations for storing the locations of defective memory cells to 25, for example. However, other criteria for determining whether to adjust the number of locations, such as a median value or some other statistical value determined during the testing, may be used. It is then determined whether the number of locations for storing the locations of defective memory cells is optimal at a step 1012. If not, an optimal value of a number of locations for storing the locations of defective memory cells is determined for a predetermined architecture of a device having programmable logic at a step 1014. For example, a cost benefit analysis of the additional circuitry required to provide redundancy versus yield is performed to determine the optimal number of storage locations. If so, a circuit is implemented in programmable logic of the integrated circuit at a step 1016.

While circuitry for an efuse repair including a storage location and a self repair state machine could be placed inside each BRAM module, the area of a BRAM module would increase by approximately 20% and in a typical FPGA, the total area of the die would increase by approximately 2-4%. This increase in cost may not justify the additional benefit provided by the repair capacity. By placing the efuse repair circuitry in a central location, the additional cost of the implementing the efuse repair in terms of area of the die is approximately 0.01-0.08%, depending upon the device and the number of efuse locations. That is, the overhead of providing the efuse is significantly reduced because the efuse circuitry does not get duplicated over all of the BRAMs on the entire die. While specific examples set forth above describe blocks of random access memory, the circuits and methods of the present invention may be implemented with blocks of memory comprising any type of memory.

It can therefore be appreciated that the new and novel circuit and method of repairing defective memory has been described. It will be appreciated by those skilled in the art that numerous alternatives and equivalents will be seen to exist which incorporate the disclosed invention. As a result, the invention is not to be limited by the foregoing embodiments, but only by the following claims.

We claim:

1. A circuit of an integrated circuit, the circuit comprising:
a plurality of blocks of memory;
interconnect elements providing data to each block of memory of the plurality of blocks of memory, the interconnect elements enabling coupling signals for programming the plurality of blocks of memory; and
a directory of locations for defective memory cells of blocks of memory, wherein the directory of locations is common to the plurality of blocks of memory for storing locations of defective memory cells of the plurality of blocks of memory.

2. The circuit of claim 1 wherein the directory of locations comprises electrically programmable fuses having a plurality of programmable elements identifying the locations of the defective memory cells.

3. The circuit of claim 1 further comprising a self-repair state machine coupled to the plurality of blocks of memory, wherein the self-repair state machine determines the locations of memory cells of the plurality of blocks of memory storing incorrect values.

4. The circuit of claim 3 wherein the self-repair state machine is implemented in programmable logic of the integrated circuit.

5. The circuit of claim 1 wherein each block of memory of the plurality of blocks of random access memory comprises read/write control logic.

6. The circuit of claim 5 wherein each block of memory of the plurality of blocks of memory comprises a redundant column.

7. The circuit of claim 6 wherein each block of memory of the plurality of blocks of memory comprises a block of random access memory having an output multiplexing network enabling the selection of an output of the redundant column in response to the read/write control logic.

8. A method of implementing a circuit of an integrated circuit, comprising:
coupling signals, using interconnect elements, for programming a plurality of blocks of memory, and providing data to each block of memory of the plurality of blocks of memory; and
storing locations of defective memory cells of the plurality of blocks of memory, wherein the locations of defective memory cells are stored in a directory of locations for the defective memory cells, and the directory of locations is common to the plurality of blocks of memory.

9. The method of claim 8 wherein the directory of locations comprises electrically programmable fuses having a plurality of programmable elements identifying the locations of the defective memory cells.

10. The method of claim 8 further comprising determing, using a self-repair state machine coupled to the plurality of blocks of memory, the locations of memory cells of the plurality of blocks of memory storing incorrect values.

11. The method of claim 10 wherein the self-repair state machine is implemented in programmable logic of the integrated circuit.

12. The method of claim 8 wherein each block of memory of the plurality of blocks of random access memory comprises read/write control logic.

13. The method of claim 12 wherein each block of memory of the plurality of blocks of memory comprises a redundant column.

14. The method of claim 13 wherein each block of memory of the plurality of blocks of memory comprises a block of random access memory having an output multiplexing network enabling the selection of an output of the redundant column in response to the read/write control logic.

15. The method of claim 8 further comprising transforming the defective memory cells of the plurality of blocks of memory by selecting a redundant column.

16. The method of claim 8 wherein the directory has a predetermined number of locations for storing data associated with the defective memory cells of the plurality of blocks of memory, and further comprising, establishing a new number of locations for storing data associated with the defective memory cells if a number of blocks of memory having defective memory cells of the pluarlity of blocks of memory exceeds the predetermined number.

* * * * *